United States Patent [19]
Moench

[11] Patent Number: 5,418,472
[45] Date of Patent: May 23, 1995

[54] INPUT LEVEL DETECTION CIRCUIT

[75] Inventor: Jerry O. Moench, Austin, Tex.

[73] Assignee: Advanced Micro Devices, Inc., Sunnyvale, Calif.

[21] Appl. No.: 134,523

[22] Filed: Oct. 8, 1993

[51] Int. Cl.$^6$ .................................... H03K 19/007
[52] U.S. Cl. .................................. 326/14; 326/9; 326/31; 327/76
[58] Field of Search ............... 307/272.3, 296.4, 296.5, 307/354, 353, 352, 350, 351, 530, 360, 572, 443; 326/9, 14, 31; 327/76

[56] References Cited

U.S. PATENT DOCUMENTS

| | | | |
|---|---|---|---|
| 4,446,381 | 5/1984 | Dalrymple | 307/296.5 |
| 4,473,759 | 9/1984 | Mahabadi | 307/296.5 |
| 4,859,872 | 8/1989 | Hyakutake | 307/352 |
| 4,902,910 | 2/1990 | Hsieh | 307/296.4 |
| 4,968,902 | 11/1990 | Jackson | 307/354 |
| 5,097,147 | 3/1992 | Stuebing et al. | 307/354 |
| 5,214,319 | 5/1993 | Abdi | 307/354 |

Primary Examiner—Timothy P. Callahan
Assistant Examiner—My-Trang Nu Ton
Attorney, Agent, or Firm—Foley & Lardner

[57] ABSTRACT

An apparatus for activating a dual-mode logic device is provided. The apparatus monitors a parameter of an input signal of the logic device. If the parameter falls outside of predetermined parametric ranges, the apparatus activates the logic device. In the preferred embodiment, the apparatus resides on the same semiconductor chip as the logic device, and monitors the voltage level of the input signal. If the voltage level falls outside the voltage range which represents a logical HIGH and the voltage range which represents a logical LOW, the apparatus activates the logic device.

20 Claims, 3 Drawing Sheets

INPUT LEVEL DETECTION CIRCUIT

BACKGROUND OF THE INVENTION

The present invention relates to an apparatus for detecting when a logic device is required to perform an operation, and more particularly to an apparatus for detecting when a parameter of a signal sent to a logic device falls outside predefined parametric ranges.

It has become increasingly important to provide computer components which consume less energy. Consequently, many logic devices (e.g. PALs and EPROMs) have been developed which may be "powered-down" when they are not being used to perform computational operations. Specifically, logic devices have been developed which assume either an idle mode or an active mode responsive to an activation signal. Such logic devices are referred to herein as dual-mode logic devices. In the idle mode, dual-mode logic devices consume little or no power, but are incapable of performing operations. In the active mode, logic devices consume more power and can perform operations.

In order to operate efficiently, dual-mode logic devices must be able to sense when they are required to perform an operation, assume the active mode, and perform the required operation, without imposing any timing delays for the activation process.

One approach to dual-mode logic device design is to provide an additional I/O pin on the semiconductor on which the dual-mode logic device resides for receiving the "wake-up" or activation signal. This external activation approach has the disadvantage that it requires additional external pins and communication lines. The approach has the further disadvantage that additional circuitry must be added to the components which call the dual-mode logic device to enable such components to send the activation signal required to activate the dual-mode logic device.

Another known approach is to provide edge-detecting activation circuitry which detects when the dual-mode logic device is receiving information which it must process by sensing the occurrence of an edge on an input line to the logic device. When an edge is detected on an input line to the logic device, edge-detecting activation circuitry causes the dual-mode logic device to assume the active mode.

The edge-detection approach avoids the need for external activation lines, but requires the use of relatively complex edge-detection circuitry. The resulting increase in circuit complexity often requires a larger die size to be used in the chip manufacturing process, making the manufacture of chips which embody dual-mode logic devices more expensive.

In light of the foregoing, it is clearly desirable to provide a circuit for detecting when a dual-mode logic device is required to perform an operation. It is further desirable to provide a circuit for causing a dual-mode logic device to assume the active mode and perform an operation without imposing any activation-related timing delays. It is also clearly desirable to provide circuitry to activate a dual-mode logic device that does not require any additional external communication lines. It is further desirable to provide a circuit for activating a dual-mode logic device that requires less complex circuitry than current edge-detection circuits.

SUMMARY OF THE INVENTION

According to one aspect of the present invention, an apparatus for activating a logic device when the logic device is required to perform an operation is provided. The logic device is configured to receive an input signal on a first line and an activation signal on a second line. The logic device is further configured to assume an active mode when the activation signal is in a first state, and to assume an idle mode when the activation signal is in a second state. The apparatus generally includes level detection means, operatively connected with the first line, for generating a level detection signal when a specified parameter of the input signal is outside a first predetermined parametric range by at least a first predetermined amount and outside a second predetermined parametric range by at least a second predetermined amount. The apparatus also includes activating means, operatively connected with the logic device and the level detection means, for receiving the level detection signal and for transmitting to the logic device the activation signal in response to the level detection signal.

According to another aspect of the present invention, an apparatus for activating a dual-mode logic device in response to a specified parameter of an input signal is provided. The logic device receives the input signal over an input line. The apparatus includes a logical HIGH sensing circuit, a logical LOW sensing circuit, and an out-of-ranges detect circuit.

The logical HIGH sensing circuit is operatively connected with the input line and generates a first signal when the specified parameter is within a logical HIGH range. The logical LOW sensing circuit is also operatively connected with the input line and generates a second signal when the specified parameter is within a logical LOW range. The out-of-ranges detect circuit is operatively connected with the logical HIGH sensing circuit, the logical LOW sensing circuit, and the logic device. The out-of-ranges detect circuit receives the first signal and the second signal, and activates the logic device when the specified parameter in not within the logical HIGH range and not within the logical LOW range.

BRIEF DESCRIPTION OF THE DRAWINGS

The features of the present invention, which are believed to be novel, are set forth with particularity in the appended claims. The invention, together with further objects and advantages thereof, may best be understood by making reference to the following description taken in conjunction with the accompanying drawings, in the several figures of which like reference numerals identify like elements, and wherein:

DESCRIPTION OF THE PREFERRED EMBODIMENT

Figure 1A:
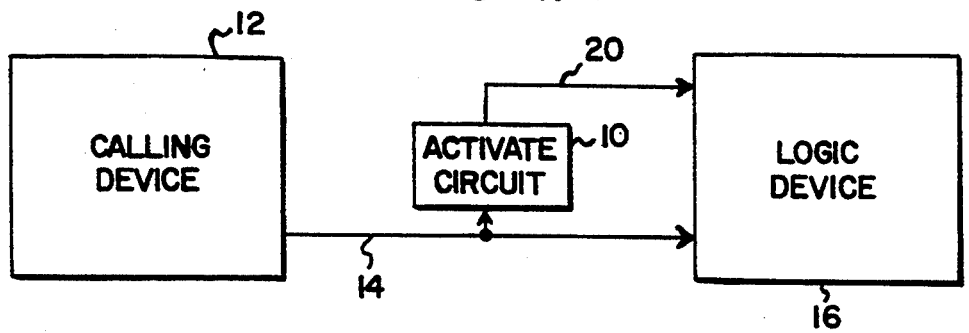
FIG. 1a is a functional block diagram of an external level-detecting activate circuit according to one embodiment of the present invention.

FIG. 1a is a functional block diagram of an external level-detecting activate circuit 10 according to one embodiment of the present invention. A calling device 12 is coupled to activate circuit 10 and to a dual-mode logic device 16 by a line 14. Activate circuit 10 is also coupled to logic device 16 by an activate control line 20.

Calling device 12 generally represents the components of a computer system which send data (an "input signal") to logic device 16 when logic device 16 is required to perform an operation. Calling device 12 transmits the input signal to logic device 16 over line 14.

Logic device 16 is configured to assume either the idle mode or the active mode responsive to the signal sent to logic device 16 over line 20. In the idle mode, logic device 16 consumes little or no power but is incapable of performing operations. In the active mode, logic device 16 consumes more power and can perform operations.

Activate circuit 10 is configured to monitor line 14 and detect when a parameter of the input signal falls outside certain predetermined parametric ranges. When the parameter of the input signal falls outside the predetermined parametric ranges, activation circuit 10 transmits an activate signal over line 20 to logic device 16 to cause logic device 16 to assume the active mode.

The specific parameter monitored by activate circuit 10 depends on the nature of the input signal. In the preferred embodiment, activate circuit 10 is employed in a conventional digital computer system in which information is communicated by the voltage levels of electrical signals. Consequently, in the preferred embodiment, the parameter monitored by activate circuit 10 is the voltage level of the input signal. Activate circuit 10 is therefore configured to detect when the voltage level of the input signal falls outside predetermined voltage level ranges, and to send a signal over line 20 to cause logic device 16 to assume the active mode when the input signal falls outside the predetermined voltage level ranges.

In voltage-level-based communication systems, signals having voltage levels within specific voltage level ranges have defined meanings. For example, a signal having a voltage level between 4.75 volts and 5.25 volts is typically considered to communicate a logical HIGH, "1", TRUE or ON. The range of voltage levels which define a valid HIGH is referred to herein as the "logical HIGH range". Conversely, a signal having a voltage level between 0.25 volts and −0.25 volts is typically considered to represent a logical LOW, "0", FALSE or OFF. The range of voltage levels which define a logical LOW is referred to herein as the "logical LOW range". The logical HIGH range and the logical LOW range are collectively referred to herein as the "predefined ranges".

When logic device 16 is required to process information, calling device 12 sends the information to logic device 16 via the input signal on line 14. For the information represented by the input signal to be accurately communicated, two conditions must be met. First, logic device 16 must read the voltage level of the input signal at predetermined read times, and second, the input signal must fall within one of the predefined ranges at the predetermined read times. The timing of the read times, and all inter-component communications, is typically determined by a system clock (not shown).

If information is not being sent on the input signal, logic device 16 is not currently required to perform an operation. Therefore, logic device 16 remains in the idle mode as long as no information is sent on the input signal. However, when information is being sent on the input signal, logic device 16 must process the information. In order to process the information, logic device 16 must first assume the active mode. Activate circuit 10 is therefore configured to send an activate signal to cause logic device 16 to assume the active mode when it detects that information is being transmitted over line 14. The manner in which activate circuit 10 detects whether information is being sent over line 14 shall now be described in greater detail.

When information is not being sent on the input signal, the voltage level of the input signal will remain constant within one of the predefined ranges. Consequently, the voltage level of the input signal will not only be within the one of the predefined ranges at the read times, but will also remain in the one of the predefined ranges during the interval between the read times.

On the other hand, if the input signal is carrying information to be processed, the actual voltage level input signal will oscillate between the predefined ranges during the interval between the read times. Consequently, the voltage level of the input signal will fall outside of both the predefined ranges at some point during the interval between the read times.

For example, if logic device 16 is required to process the information "10", the input signal on line 14 will fall within the logical HIGH range at a first read time and within the logical LOW range at a subsequent read time. However, during the interval between the first read time and the subsequent read time, the voltage level of the input signal must drop from the logical HIGH range to the logical LOW range. The transition from a voltage level within one of the predefined ranges to a voltage level within another of the predefined ranges is continuous rather than instantaneous. Therefore, at some point in the interval between read times, the voltage level of the input signal will fall outside both of the predefined ranges.

Thus, when the voltage level of the input signal does not fall outside the predefined ranges between read times, one may assume that line 14 is not being used to transmit information, and that logic device 16 is not required to perform an operation. Conversely, when the voltage level of the input signal does fall outside the predefined ranges between read times, one may assume that line 14 is being used to transmit information, and that logic device 16 is required to perform an operation.

Consequently, activate circuit 10 is configured to sense the voltage level on line 14 and to send an activate signal over line 20 to activate logic device 16 when activate circuit 10 detects that the voltage level on line 14 falls outside the predefined ranges. The specific circuitry to accomplish this function will be described in greater detail below.

Figure 1B:
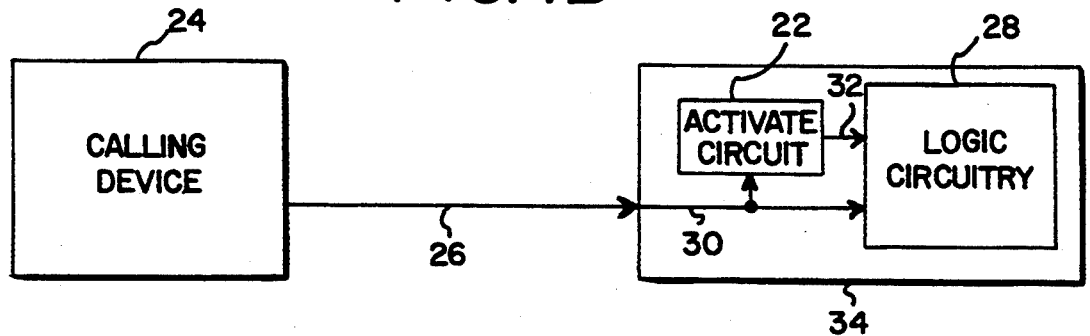
FIG. 1b illustrates an internal activate circuit according to an alternate, preferred embodiment of the present invention.

FIG. 1b illustrates an internal activate circuit 22 according to an alternate, preferred embodiment of the present invention. Activate circuit 22 functions in a manner analogous to activate circuit 10, as described above. Specifically, activate circuit 22 monitors a input signal which a calling device 24 sends to a logic device 34 over external line 26 and internal line 30, and sends an activate signal to cause logic circuitry 28 within logic device 34 to send an active signal over a line 32 when the voltage level of the input signal falls outside the predefined ranges.

The difference between activate circuit 22 and activate circuit 10 is that activate circuit 22 is built directly into logic device 34 along with the logic circuitry 28 which activate circuit 22 activates. This embodiment is preferred to that shown in FIG. 1a because it eliminates the need for an external activate line. Consequently, the fact that logic device 34 assumes an idle mode when it is not performing operations is completely transparent to the computer system in which logic device 34 is employed, and to the user thereof, except for the resulting decrease in power consumption.

Figure 2:
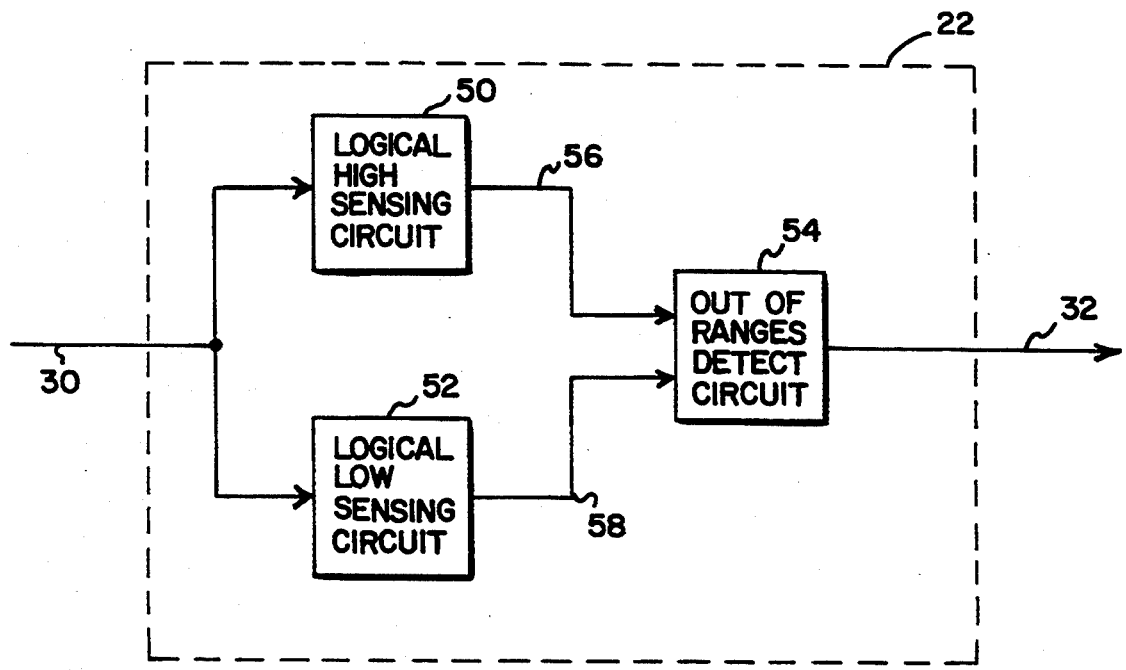
FIG. 2 is a functional block diagram illustrating the activate circuit of FIG. 1b in greater detail.

FIG. 2 is a functional block diagram illustrating activate circuit 22 in greater detail. Activate circuit 22 generally comprises a logical HIGH sensing circuit 50, a logical LOW sensing circuit 52 and an out-of-ranges detect circuit 54.

Logical HIGH sensing circuit 50 is connected with line 30, and is connected with out-of-ranges detect circuit 54 over a line 56. Logical HIGH sensing circuit 50 monitors the signal on line 30 and sends a signal over line 56 to out-of-ranges detect circuit 54 when the signal on line 30 represents a logical HIGH. More specifically, logical HIGH sensing circuit 50 monitors the voltage level on line 30, and when the voltage level of line 30 falls within the logical HIGH range, logical HIGH sensing circuit 50 sends a signal over line 56 to out-of-ranges detect circuit 54 to indicate that the signal on line 30 represents a logical HIGH.

Logical LOW sensing circuit 52 is also connected with line 30, and is connected with out-of-ranges detect circuit 54 by a line 58. Logical LOW sensing circuit 52 monitors the signal on line 30 and sends a signal over line 58 to out-of-ranges detect circuit 54 when a signal on line 30 represents a logical LOW. More specifically, logical LOW sensing circuit 52 senses when the voltage level on line 30 falls within the logical LOW range, and transmits a signal over line 58 to out-of-ranges detect circuit 54 when the voltage level on line 30 falls within the logical LOW range.

Out-of-range detect circuit 54 receives the signal from logical HIGH sensing circuit 50 over line 56, which signal is indicative of whether the signal on line 30 represents a logical HIGH, and the signal sent by logical LOW sensing circuit 52 over line 58, which signal indicates whether the signal on line 30 represents a logical LOW. Based on the information contained in these signals, the out-of-ranges detect circuit determines if the signal on line 30 is neither a logical HIGH nor a logical LOW. If the signal on line 30 is neither a logical HIGH nor a logical LOW, out-of-ranges detect circuit 54 transmits an activate signal over line 32. As a result, an activate signal is sent over line 32 whenever the signal on line 30 is neither a logical HIGH nor a logical LOW.

As explained above, the only time the input signal on line 30 is neither HIGH nor LOW is when the input signal is changing from LOW to HIGH or from HIGH to LOW. The only time the voltage level of the input signal changes from one of the predefined ranges to another is when information is being sent by the input signal. Information is only sent on the input signal when logic circuitry 28 is required to perform an operation. Consequently, an activation signal is sent on line 32 if and only if logic circuitry 28 is needed to perform an operation.

Figure 3:
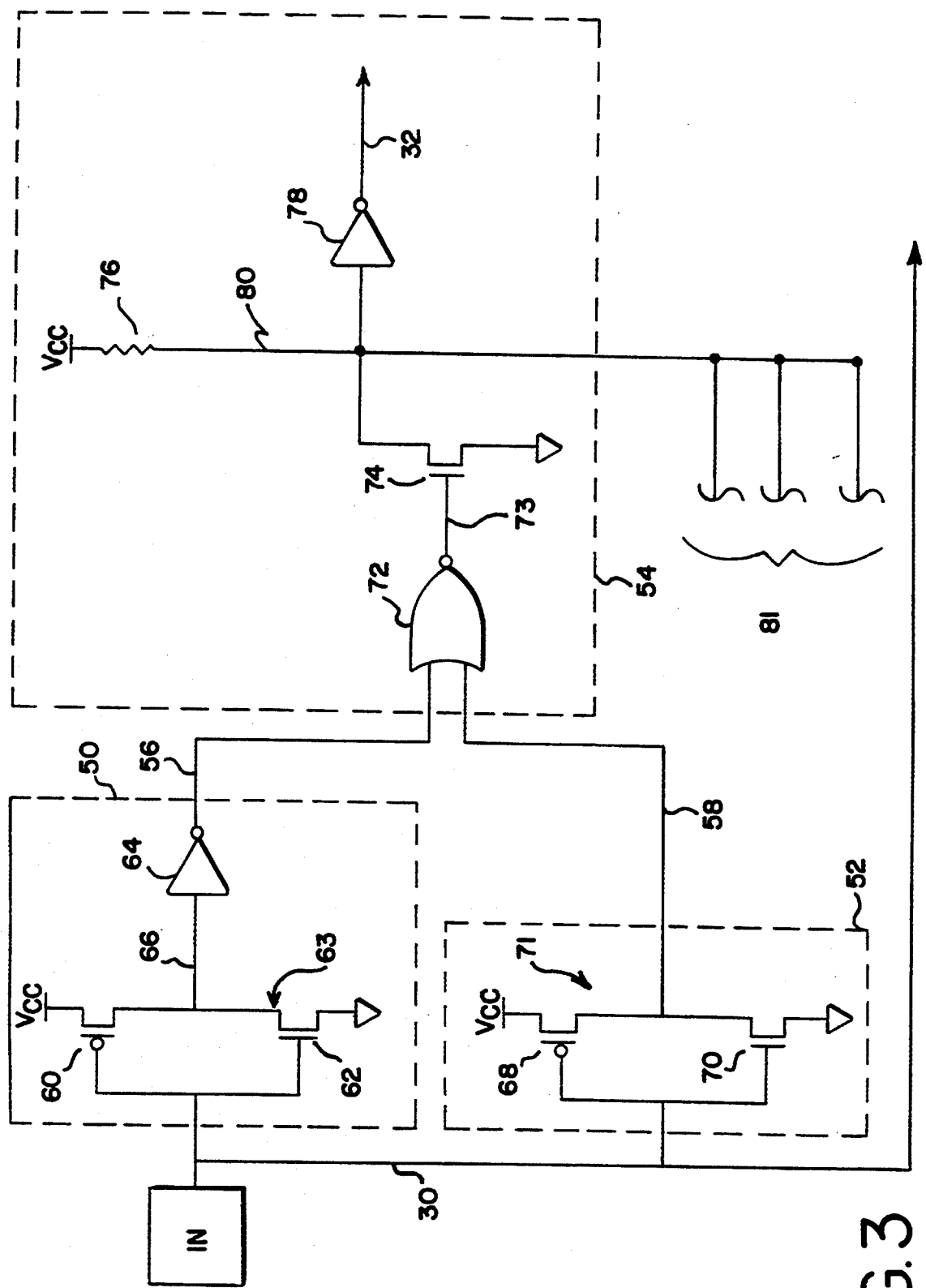
FIG. 3 is a schematic diagram illustrating activate circuit according to the preferred embodiment of the invention.

FIG. 3 is a schematic diagram illustrating activate circuit 22 according to the preferred embodiment of the invention. Logical HIGH sensing circuit 50 generally comprises a high gain P-MOS field effect transistor (FET) 60, a resistive N-MOS FET 62, and an inverter 64. The gate of FET 60 is coupled to line 30, and the channel of FET 60 connects an operating voltage level ("Vcc") source with a line 66. Line 66 is connected to the input of inverter 64.

Since FET 60 is a P-MOS FET, its channel is conductive when the voltage level at its gate falls below a threshold voltage. Specifically, FET 60 is a high gain FET, and is configured to render its channel conductive when the voltage level at its gate falls below the lower threshold voltage level of the logical HIGH range. For example, if the logical HIGH range is from 4.75 volts to 5.25 volts, FET 60 is configured to render its channel conductive when the voltage level at its gate falls below the threshold voltage of the P-channel. The lower threshold of the logical HIGH range is referred to herein as the lowest HIGH value.

The gate of N-MOS FET 62 is connected to line 30, and the channel of FET 62 connects ground with line 66. Since FET 62 is an N-MOS FET, its channel is rendered conductive when the voltage level at its gate exceeds a threshold voltage of the n-channel. FET 62 is resistive, is configured to render its channel conductive when the voltage level at its gate exceeds the lowest HIGH value.

Consequently, FET 60 and FET 62 collectively constitute an inverter 63, For example, when the signal on line 30 falls below the lowest HIGH value, the channel of FET 60 is rendered more conductive and the channel of FET 62 is less conductive. As a result, line 66 is driven near Vcc. Conversely, when the signal on line 30 exceeds the lowest HIGH value, the channel of FET 62 is conductive and the channel of FET 60 is non-conductive. As a result, line 66 is driven to ground.

Line 66 is attached to the input of inverter 64. Consequently, inverter 64 transmits a logical LOW over line 56 when line 66 is near Vcc, and a logical HIGH over line 56 when line 66 is near ground. As a result, the signal on line 56 is HIGH when the voltage level on line 30 exceeds the lowest HIGH value, and the signal on line 56 is LOW when the voltage level on line 30 falls below the lowest HIGH value.

Logical LOW sensing circuit 52 generally comprises a resistive P-MOS field effect transistor (FET) 68, and a high gain N-MOS FET 70. The gate of FET 68 is coupled to line 30, and the channel of FET 68 connects Vcc with line 58.

Figure 4:
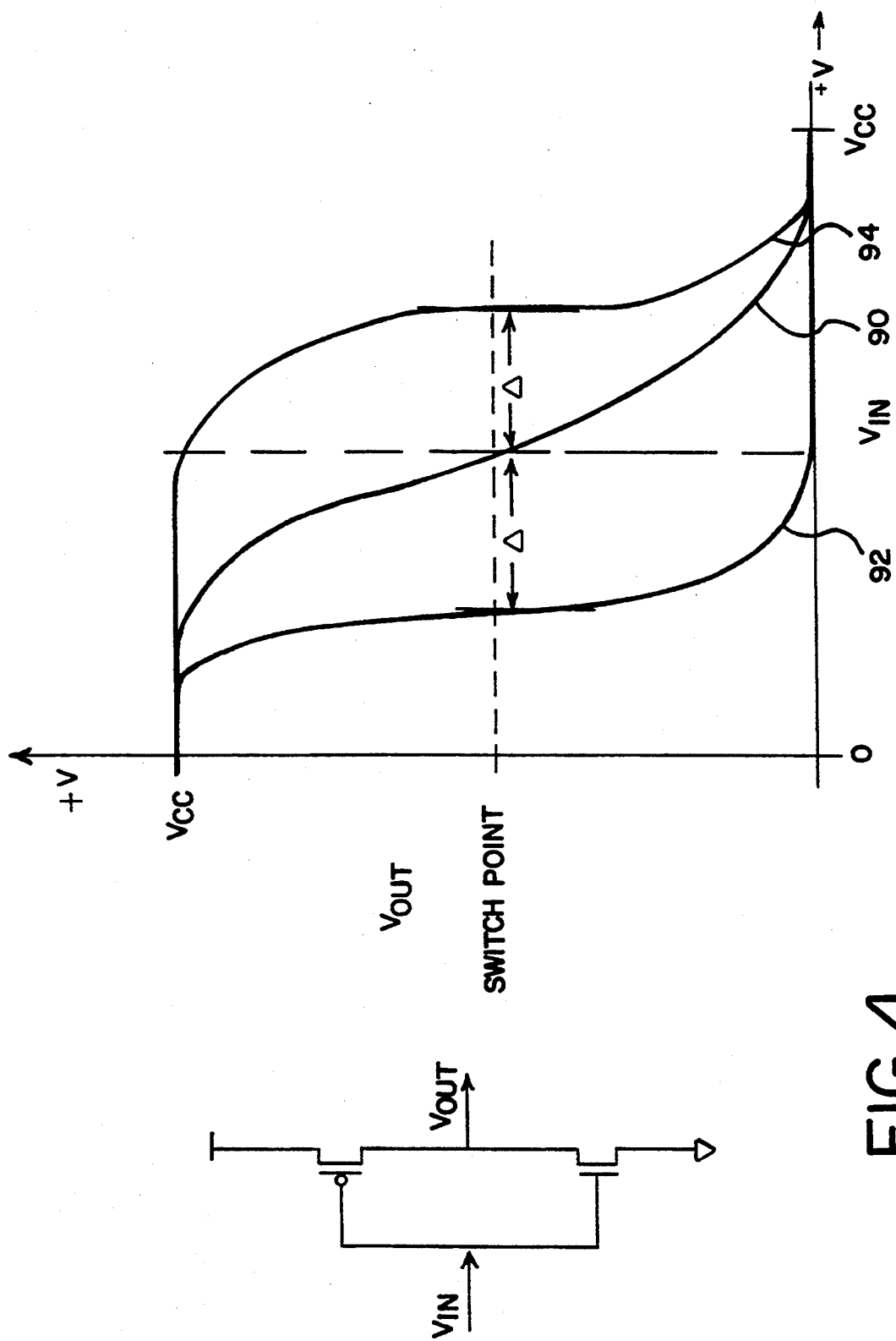
FIG. 4 is a diagram of the response curves of skewed inverters relative to the response curve of a normal inverter.

Since FET 68 is a resistive P-MOS FET, its channel is slightly conductive when the voltage level at its gate falls below the source voltage (Vcc) by more than the P-channel threshold voltage. The N-channel FET 70 is a highly conductive N-channel device which, when its gate voltage is more than the N-channel threshold voltage above the source (ground), will quickly pull the drain voltage node 58 low. The input transfer curve of this inverter is shown in FIG. 4 curve 92.

Since FET 60 is a highly conductive P-MOS FET, its channel is highly conductive when the voltage level at its gate falls below the source voltage (Vcc) by more than the P-channel threshold voltage. The N-channel FET 62 is a resistive N-channel device which, when its gate voltage is more than the N-channel threshold voltage about the source (ground), will slightly pull node 66 low. The input transfer curve of this inverter is shown in FIG. 4 curve 94.

During operation, if the input starts low, both nodes 66 and 58 are high. As the input switches from the low state to the high state, the inverter 71 quickly pulls node 58 low as the input level passes the switch point of the inverter 71. Inverter 63 is slow to respond to a low to high transition since the FET 62 is a resistive N-channel and thus node 66 stays high and node 56 stays low until well after the input has passed the high switch point of the inverter 63. Since both inputs into NOR gate 72 are low, a high pulse will occur on the output node 73. The pulse width of this signal is determined by the delay of the slow high to low transition of inverter 63 and the input rise time of the input signal to go between the switch point of inverter 63 and 71.

Conversely, if the input signal starts high, both nodes 66 and 58 are low. As the input switches from the high state to the low state, the inverter 63 quickly pulls node 66 high, cause 56 to quickly go low. Since inverter 58 is slow at going high, both nodes 58 and 56 are again low, causing the output of the NOR gate 72 to go high again.

If the input signal is sitting between the two switch points, then the DC response of the circuit takes over. In this case, the inverter 63 having a high switch point pulls node 66 low, causing node 56 to go low. The inverter 71 has a low switch point, causing the output node 58 to go low. Therefore, with both 58 and 56 low, the DC response is the same as a transition response and NOR gate 72 output is high. This high output of input level detection circuit is logically ORed together with all other inputs coming into the device with the circuit shown in FIG. 3. This is a wired NOR implementation with an inverter 78 to make it an OR function of any input transition. This causes the circuit to respond to any input transition or any input level which is in an indeterminate state.

In the preferred embodiment of the present invention illustrated in FIG. 3, signals outside predetermined parametric ranges (e.g., outside the logical HIGH range and outside the logical LOW range) will result in an appropriate output from NOR gate 72 to generate and activate signal on line 32. Of course, a marginal offset could be introduced. That is, the activate signal could be triggered only when the input signal is a predetermined marginal amount outside the predetermined parametric ranges. Thus, the marginal amount may be viewed as being zero in the preferred embodiment illustrated in FIG. 3.

Out-of-ranges detect circuit 54 generally comprises a NOR gate 72, a N-MOS FET 74, a resistor 76 and an inverter 78. NOR gate 72 has one input connected to line 56 and another input connected to line 58. The output of NOR gate is connected to the gate of FET 74. The channel of FET 74 connects a line 80 to ground. Line 80 is connected to Vcc through resistor 76, and to the input of inverter 78. The output of inverter 78 is connected to line 32.

NOR gate 72 performs a logical NOR operation based on the state of lines 56 and 58. Thus, if line 56 is at a logical HIGH, the output of NOR gate 72 will be LOW regardless of the state of line 58. Similarly, if line 58 is at a logical HIGH, the output of NOR gate 72 will be a logical LOW, regardless of the state of line 56. Since, as described above, line 56 will be HIGH if the signal on line 30 is within the logical HIGH range, and the signal on line 58 will be at a logical HIGH when the signal on line 30 is within the logical LOW range, the output of NOR gate 72 will be LOW if the signal on line 30 falls within either of the predefined ranges, and will be HIGH only when the signal on line 30 falls outside both of the predefined ranges.

The gate of FET 74 is connected to the output of NOR gate 72. Therefore, the channel of FET 74 is conductive, driving line 80 to ground, when voltage level of the signal on line 30 falls outside the predefined ranges, and is nonconductive when the voltage level of the signal on line 30 falls within either one of the predefined ranges. When line 80 is driven to ground, inverter 78 generates a logical HIGH over line 32. When the channel of FET 74 is not conductive, line 80 is driven to Vcc through resistor or pullup device 76, causing inverter 78 to output a logical LOW. Consequently, line 32 will be LOW when the voltage level on line 30 is in either of the predefined ranges, and will be HIGH when the voltage level on line 30 falls outside both of the predefined ranges.

As mentioned above, the N-MOS and P-MOS FET subcircuits of both logical HIGH sensing circuit 50 and logical LOW sensing circuit 52 function like skewed inverters. A normal, non-skewed inverter generates a logical HIGH when its input signal falls within the logical LOW range, generates a logical LOW when its input signal falls within the logical HIGH range, and generates a voltage level halfway between HIGH and LOW (the "inverter switch voltage") when its input signal is halfway between HIGH and LOW (the "input switch voltage").

Inverters 63 and 71 also generate a logical LOW when the input signal is HIGH, and a logical HIGH when the input signal is LOW. However, inverters 63 and 71 are skewed in that their respective inverter switch voltages do not coincide with a balanced switch inverter. For example, the output of inverter 63 is HIGH when the input signal is at the input switch voltage, and the output of inverter 71 is LOW when the input signal is at the input switch voltage. Consequently, as the voltage level of the input signal goes from a logical LOW to a logical HIGH, the output of both inverters 63 and 71 will initially be HIGH. The output of inverter 71 begins to drop immediately when the voltage level of the input signal exceeds the highest LOW value, and is LOW by the time the input signal reaches the input switch voltage. The output of inverter 63 does not begin to drop from HIGH until after the input signal reaches the input switch voltage. By the time the voltage level of the input signal is HIGH, the output of inverter 63 is LOW.

FIG. 4 is a diagram of the response curves of skewed inverters 63 and 71 relative to a normal inverter. As shown in the diagram, a response curve 90 of a normal inverter is HIGH when the input voltage level is LOW, is LOW when the input voltage level is HIGH, and is at the inverter switch voltage when the input voltage level is at the input switch voltage.

The response curve of inverter 71 (FIG. 3) is shown as curve 92. In contrast to a normal inverter, the output of inverter 71 has completed the transition from HIGH to LOW by the time the input signal is at the input switch voltage.

The response curve of inverter 63 (FIG. 3) as curve 94. In contrast to a normal inverter, as the voltage of the input signal rises from LOW to HIGH, the output of inverter 63 does not begin the transition from HIGH to LOW until after the input voltage level is past the input switch voltage. Consequently, when the input signal is at the input switch voltage, the output of inverter 71 will be LOW, the output of inverter 63 will be HIGH, the output of logical LOW sensing circuit 52 will be LOW, and the output of logical HIGH sensing circuit 50 will be LOW.

Typically, a logic device will have more than one input line. Under such circumstances, the voltage level at each input line will be monitored by a circuit as described above. In the preferred embodiment of the invention, each of the circuits will include a transistor, analogous to transistor 74, connected to line 80 and configured to drive line 80 to near ground when a voltage level change is detected on its respective input line. Connections to other level detection circuits are generally indicated by reference numeral 81 in FIG. 3. Thus configured, line 80 will be driven to ground when the voltage level on any input line changes. Therefore, line 32 will be driven HIGH upon the occurrence of any such input level change. Thus, the combination of line 80 and inverter 78 functions as a NOR gate with respect to the output signals coming from the various input level detection circuits connected to line 80.

It is to be understood that the detailed drawings and specific examples given describe a preferred embodiment of the invention and are for the purpose of illustration only, and that the apparatus of the invention is not limited to the precise details and conditions disclosed. For example, the magnitude of the skew of inverters 63 and 71 may be adjusted to cause the activation signal to be sent only when the voltage level of the input signal exceeds the highest LOW value by first predetermined amount, and the falls below the lowest HIGH value by a second predetermined amount. It is to be understood that these and various other changes may be made without departing from the spirit of the invention which is defined by the following claims:

What is claimed is:

1. An apparatus for activating a logic device when said logic device is required to perform an operation, said logic device being configured to receive an input data signal on a first line and an activation signal on a second line, said logic device being configured to assume an active mode when said activation signal is in a first state, said logic device being configured to assume an idle mode when said activation signal is in a second state, the apparatus comprising:

level detection means, operatively connected with said first line, for generating a level detection signal when a specified parameter of said input data signal is outside a first predetermined parametric range by at least a first predetermined amount and outside a second predetermined parametric range by at least a second predetermined amount; said first predetermined parametric range and said second predetermined parametric range defining binary logic states of said logic device in said idle mode; and activating means, operatively connected with said logic device and said level detection means, for receiving said level detection signal and for transmitting to said logic device said activation signal in response to said level detection signal; said activation signal being in said first state when said level detection signal is received, said activation signal being in said second state when said level detection signal is not received.

2. An apparatus for activating a logic device when said logic device is required to perform an operation, as recited in claim 1, wherein said level detection means includes:

a first circuit, operatively connected with said first line, for generating a first signal indicative of whether said specified parameter is outside said first predetermined parametric range by at least said first predetermined amount;

a second circuit, operatively connected with said first line, for generating a second signal indicative of whether said specified parameter is outside said second predetermined parametric range by at least said second predetermined amount; and a logic circuit, operatively connected with said first circuit, said second circuit and said activating means, for receiving said first signal and said second signal, and for generating said level detection signal responsive to said first signal and said second signal, said level detection signal having a predetermined logical relationship with said first signal and said second signal.

3. An apparatus for activating a logic device when said logic device is required to perform an operation, as recited in claim 2, wherein said first signal is HIGH when said specified parameter is outside said first predetermined parametric range by at least said first predetermined amount, said second signal being HIGH when said specified parameter is outside said second predetermined parametric range by at least said second predetermined amount, said logic circuit comprising a NOR gate having a first input, a second input and an output, said first input receiving said first signal, said second input receiving said second signal, and said output generating said level detection signal.

4. An apparatus for activating a logic device when said logic device is required to perform an operation, as recited in claim 2, wherein said first circuit comprises a first skewed inverter having a first input and a first output, said first input being operatively connected with said first line.

5. An apparatus for activating a logic device when said logic device is required to perform an operation, as recited in claim 4, wherein said second circuit comprises a second skewed inverter having a second input and a second output, said second input being operatively connected with said first line.

6. An apparatus for activating a logic device when said logic device is required to perform an operation, as recited in claim 5, wherein said first skewed inverter comprises a first FET and a second FET, said first FET having a first gate and a first channel, said first gate being operatively connected with said first line, said first channel being conductive when said specified parameter is outside said first predetermined parametric range by at least said first predetermined amount, said second FET having a second gate and a second channel, said second gate being operatively connected with said first line, said second channel being nonconductive when said specified parameter is outside said first predetermined parametric range by at least said first predetermined amount.

7. An apparatus for activating a logic device when said logic device is required to perform an operation, as recited in claim 6, wherein said second skewed inverter comprises a third FET and a fourth FET, said third FET having a third gate and a third channel, said third gate being operatively connected with said first line, said third channel being conductive when said specified parameter is outside said second predetermined parametric range by at least said second predetermined amount, said fourth FET having a fourth gate and a fourth channel, said fourth gate being operatively connected with said first line, said fourth channel being nonconductive when said specified parameter is outside said second predetermined parametric range by at least said second predetermined amount.

8. An apparatus for activating a logic device when said logic device is required to perform an operation, as recited in claim 7, wherein said first circuit further includes a non-skewed inverter having a third input and a third output, said third input being operatively connected with said first output, said third output generating said first signal.

9. An apparatus for activating a logic device when said logic device is required to perform an operation, as recited in claim 1, wherein the apparatus resides on the same semiconductor chip as said logic device.

10. An apparatus for activating a dual-mode logic device in response to a specified parameter of an input data signal, said logic device receiving said input data signal over an input data line, the apparatus comprising:
- a logical HIGH sensing circuit, operatively connected with said input data line, for generating a first signal when said specified parameter is within a logical HIGH range;
- a logical LOW sensing circuit, operatively connected with said input data line, for generating a second signal when said specified parameter is within a logical LOW range;
- an out-of-ranges detect circuit, operatively connected with said logical HIGH sensing circuit, said logical LOW sensing circuit, and said logic device, for receiving said first signal and said second signal, and for activating said logic device when said specified parameter is not within said logical HIGH range and not within said logical LOW range.

11. An apparatus for activating a dual-mode logic device in response to a specified parameter of an input signal, as recited in claim 10, wherein the apparatus resides on the same semiconductor chip as said logic device.

12. An apparatus for activating a dual-mode logic device in response to a specified parameter of an input signal, as recited in claim 11, wherein said out-of-ranges detect circuit includes:
- a logic circuit, operatively connected with said logical HIGH sensing circuit and said logical LOW sensing circuit, for receiving said first signal and said second signal, and for generating a level detection signal responsive to said first signal and said second signal, said level detection signal having a predetermined logical relationship with said first signal and said second signal; and
- activating means, operatively connected with said logic device and said logic circuit, for receiving said level detection signal and for activating said logic device in response to said level detection signal.

13. An apparatus for activating a dual-mode logic device in response to a specified parameter of an input signal, as recited in claim 12, wherein said first signal is HIGH when said specified parameter is outside said logical HIGH range by at least a first predetermined amount, said second signal being HIGH when said specified parameter is outside said logical LOW range by at least a second predetermined amount.

14. An apparatus for activating a dual-mode logic device in response to a specified parameter of an input signal, as recited in claim 13, wherein said logic circuit comprises a NOR gate having a first input, a second input and an output, said first input receiving said first signal, said second input receiving said second signal, and said output generating said level detection signal.

15. An apparatus for activating a dual-mode logic device in response to a specified parameter of an input signal, as recited in claim 12, wherein said logical HIGH sensing circuit comprises a first skewed inverter having a first input and a first output, said first input being operatively connected with said first line.

16. An apparatus for activating a dual-mode logic device in response to a specified parameter of an input signal, as recited in claim 15, wherein said second circuit comprises a second skewed inverter having a second input and a second output, said second input being operatively connected with said first line.

17. An apparatus for activating a dual-mode logic device in response to a specified parameter of an input signal, as recited in claim 16 wherein said first skewed inverter comprises a first FET and a second FET, said first FET having a first gate and a first channel, said first gate being operatively connected with said first line, said first channel being conductive when said specified parameter is outside said logical HIGH range by at least said first predetermined amount, said second FET having a second gate and a second channel, said second gate being operatively connected with said first line, said second channel being nonconductive when said specified parameter is outside said logical HIGH range by at least said first predetermined amount.

18. An apparatus for activating a dual-mode logic device in response to a specified parameter of an input signal, as recited in claim 17, wherein said second skewed inverter comprises a third FET and a fourth FET, said third FET having a third gate and a third channel, said third gate being operatively connected with said first line, said third channel being conductive when said specified parameter is outside said logical LOW range by at least said second predetermined amount, said fourth FET having a fourth gate and a fourth channel, said fourth gate being operatively connected with said first line, said fourth channel being nonconductive when said specified parameter is outside said logical LOW range by at least said second predetermined amount.

19. An apparatus for activating a dual-mode logic device in response to a specified parameter of an input signal, as recited in claim 18, wherein said first FET is a high gain P-MOS FET, said second FET is a resistive N-MOS FET, said third FET is a resistive P-MOS FET and said fourth FET is a high gain N-MOS FET.

20. An apparatus for activating a dual-mode logic device in response to a specified parameter of an input signal, as recited in claim 19, wherein said logical HIGH sensing circuit further includes a non-skewed inverter having a third input and a third output, said third input being operatively connected with said first output, said third output generating said first signal.

* * * * *